US008858447B2

(12) United States Patent
Chung (10) Patent No.: US 8,858,447 B2
(45) Date of Patent: Oct. 14, 2014

(54) ULTRASONIC TRANSDUCER AND METHOD OF MANUFACTURING THE SAME

(75) Inventor: Seok-whan Chung, Hwaesong-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 13/568,827

(22) Filed: Aug. 7, 2012

(65) Prior Publication Data

US 2013/0049526 A1 Feb. 28, 2013

(30) Foreign Application Priority Data

Aug. 24, 2011 (KR) .................. 10-2011-0084822

(51) Int. Cl.
 *A61B 8/14* (2006.01)
 *H02N 11/00* (2006.01)
 *B32B 37/14* (2006.01)
 *B32B 38/10* (2006.01)

(52) U.S. Cl.
 CPC ............. *B32B 37/14* (2013.01); *H02N 11/00* (2013.01); *B32B 38/10* (2013.01)
 USPC ........... 600/459; 600/437; 310/309; 310/322; 310/324

(58) Field of Classification Search
 None
 See application file for complete search history.

(56) References Cited

U.S. PATENT DOCUMENTS

| 7,027,284 | B2 | 4/2006 | Kobayashi et al. |
| 7,615,834 | B2 | 11/2009 | Khuri-Yakub et al. |
| 7,618,391 | B2 | 11/2009 | Madsen et al. |
| 2002/0079743 | A1 | 6/2002 | Ma et al. |
| 2004/0085858 | A1 | 5/2004 | Khuri-Yakub et al. |
| 2005/0046311 | A1 | 3/2005 | Baumgartner et al. |
| 2005/0096546 | A1* | 5/2005 | Hazard et al. .................. 600/447 |
| 2005/0146240 | A1* | 7/2005 | Smith et al. .................... 310/309 |
| 2005/0177045 | A1* | 8/2005 | Degertekin et al. ........... 600/457 |
| 2005/0200241 | A1* | 9/2005 | Degertekin .................... 310/334 |
| 2005/0200541 | A1 | 9/2005 | Bassily |
| 2006/0272139 | A1* | 12/2006 | Kinoshita ..................... 29/25.35 |
| 2007/0299345 | A1 | 12/2007 | Adachi et al. |
| 2008/0194053 | A1 | 8/2008 | Huang |
| 2008/0197751 | A1* | 8/2008 | Huang ........................... 310/311 |
| 2009/0076393 | A1 | 3/2009 | Adachi et al. |
| 2010/0232257 | A1* | 9/2010 | Tanaka et al. ...................... 367/7 |
| 2011/0128083 | A1* | 6/2011 | Pomarico et al. ............. 331/156 |
| 2012/0150041 | A1* | 6/2012 | Kim et al. ..................... 600/459 |

FOREIGN PATENT DOCUMENTS

| JP | 2004350700 A | 12/2004 |
| JP | 2007-214874 A | 8/2007 |
| JP | 2007-274293 A | 10/2007 |
| JP | 2009-100459 A | 5/2009 |

(Continued)

OTHER PUBLICATIONS

Communication, dated Jul. 18, 2013, issued by the U.S. Patent and Trademark Office in counterpart U.S. Appl. No. 13/168,473.

*Primary Examiner* — Long V. Le
*Assistant Examiner* — Bradley Impink
(74) *Attorney, Agent, or Firm* — Sughrue Mion, PLLC (57) ABSTRACT

An ultrasonic transducer and a method of manufacturing the same. The ultrasonic transducer includes a substrate, a supporting unit that is disposed on the substrate and comprises a through-hole, a thin-film disposed over the substrate in a region corresponding to the through-hole, wherein the thin-film is separated from the substrate and the supporting unit, and a connection unit that connects the supporting unit to the thin-film. In the method of manufacturing the ultrasonic transducer, a plurality of SOI wafers and a Si wafer are bonded without performing an aligning process.

13 Claims, 6 Drawing Sheets

(56) References Cited

FOREIGN PATENT DOCUMENTS

| | | |
|---|---|---|
| JP | 2009-118093 A | 5/2009 |
| JP | 2009182838 A | 8/2009 |
| WO | 2005/077012 A2 | 8/2005 |
| WO | 2007/005036 A2 | 1/2007 |
| WO | 2008/038454 A1 | 4/2008 |

* cited by examiner

ULTRASONIC TRANSDUCER AND METHOD OF MANUFACTURING THE SAME

CROSS-REFERENCE TO RELATED APPLICATIONS

This application claims priority from Korean Patent Application No. 10-2011-0084822, filed on Aug. 24, 2011, in the Korean Intellectual Property Office, the disclosure of which is incorporated herein in its entirety by reference.

BACKGROUND

1. Field

Apparatuses and methods consistent with exemplary embodiments relate to ultrasonic transducers and methods of manufacturing the same, and more particularly, to ultrasonic transducers having increased transmission outputs and receiving sensitivity and methods of manufacturing the same.

2. Description of the Related Art

Micromachined ultrasonic transducers (MUT) transform electrical signals into ultrasonic signals or, in reverse, transform ultrasonic signals into electrical signals. Ultrasonic transducers are used in, for example, medical imaging diagnostic apparatuses and are useful for non-invasively taking photos or images of tissues or organisms within the human body. Also, an ultrasonic transducers may be a piezoelectric micromachined ultrasonic transducer (pMUT), a capacitive micromachined ultrasonic transducer (cMUT), or a magnetic micromachined ultrasonic transducer (mMUT) according to a transformation method employed thereby.

SUMMARY

One or more exemplary embodiments may provide ultrasonic transducers having increased transmission outputs and receiving sensitivity and methods of manufacturing the same.

Additional aspects of exemplary embodiments will be set forth in part in the description which follows and, in part, will be apparent from the description, or may be learned by practice of the presented embodiments.

According to an aspect of an exemplary embodiment, there is provided an ultrasonic transducer comprising: a substrate; a supporting unit that is disposed on the substrate and comprises a through-hole; a thin-film disposed over the substrate in a region corresponding to the through-hole, wherein the thin film is separated from the substrate and the supporting unit; and a connection unit that connects the supporting unit to the thin-film.

The connection unit may include: a first connection unit part that is connected to the thin-film; a second connection unit part that is connected to the supporting unit; and a deformation unit that connects the first and second connection unit parts and is elastically deformable.

The supporting unit may include a first supporting unit part disposed on the substrate and a second supporting unit part disposed on the first supporting unit.

The first and second supporting unit parts may include different materials.

The thin-film and the second supporting unit parts may include the same material.

The ultrasonic transducer may further include an insulating layer disposed on the substrate.

The thin-film may vibrate in a direction substantially perpendicular to the substrate due to the deformation of the deformation unit.

The ultrasonic transducer may further include an electrode layer disposed on the thin-film and the connection unit.

The substrate, the supporting unit, the thin-film, and the connection unit may form a cavity.

At least one of the group consisting of the substrate and the thin-film may include a conductive material.

A gap between the substrate and the thin-film may be defined by a height of the first supporting unit part.

According to an aspect of another exemplary embodiment, there is provided a method of bonding first and second wafers, the method may include forming a first pattern on the first wafer and bonding the second wafer onto the first wafer without performing an aligning process.

The method may further include forming a second pattern on the first wafer or the second wafer and bonding a third wafer onto the second pattern without performing an aligning process.

The first, second, and third wafers may each include a silicon-on-insulator (SOI) wafer or a silicon wafer.

The first, second, and third wafers may be bonded to each other by a silicon direct bonding (SDB) method.

According to an aspect of another exemplary embodiment, there is provided a method of manufacturing an ultrasonic transducer, the method may include: forming a connection unit on a first device wafer of a first SOI wafer, wherein the first SOI wafer comprises the first device wafer, a first insulating layer, and a first handle wafer; forming a deformation unit by patterning the first device wafer; bonding a second SOI wafer onto the connection unit, wherein the second SOI waver comprises a second device wafer, a second insulating layer, and a second handle wafer; removing the second insulating layer and the second handle wafer, leaving the second device wafer on the connection unit; forming a first supporting unit on the second device wafer; forming a thin-film and a second supporting unit by patterning the second device wafer; bonding a substrate wafer onto the first supporting unit; and removing the first insulating layer and the first handle wafer.

The method may further include forming an insulating layer on the substrate wafer.

The second supporting unit may be formed on the first supporting unit.

The connection unit may include a first connection unit part and a second connection unit part, wherein the first connection unit part and the second connection unit part are separated from each other and may be connected by the deformation unit.

The first SOI wafer and the second SOI wafer wafers may be bonded to each other by a direct silicon bonding (DSB) method.

The bonding the second SOI wafer may include bonding the second SOI wafer without performing an aligning process, and the second SOI wafer may include a second device wafer, a second insulating layer, and a second handle wafer.

At least one of the wafer and the thin-film may include a conductive material.

The method may further include forming an electrode layer on the thin-film and the connection unit.

The connection unit may be formed by patterning a first oxide layer after forming the first oxide layer by oxidizing a surface of the first device wafer.

The first supporting unit may be formed by patterning a second oxide layer after forming the second oxide layer by patterning a surface of the second device wafer.

BRIEF DESCRIPTION OF THE DRAWINGS

These and/or other exemplary aspects will become apparent and more readily appreciated from the following description of exemplary embodiments, taken in conjunction with the accompanying drawings in which.

DETAILED DESCRIPTION

Various exemplary embodiments will now be described more fully with reference to the accompanying drawings.

Detailed exemplary embodiments are described herein. However, specific structural and functional details disclosed herein are merely representative for purposes of describing exemplary embodiments. The inventive concept may, however, may be embodied in many alternate forms and should not be construed as limited to only the exemplary embodiments set forth herein.

It should be understood, that there is no intent to limit exemplary embodiments to the particular forms disclosed, but on the contrary, exemplary embodiments are intended to cover all modifications, equivalents, and alternatives as would be understood by one of skill in the art. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or," includes any and all combinations of one or more of the associated listed items.

It will be understood that when an element or layer is referred to as being "formed on," another element or layer, it may be directly or indirectly formed on the other element or layer. That is, for example, intervening elements or layers may be present. In contrast, when an element or layer is referred to as being "directly formed on," to another element, there are no intervening elements or layers present. Other words used to describe the relationship between elements or layers should be interpreted in a like fashion (e.g., "between," versus "directly between," "adjacent," versus "directly adjacent," etc.).

The terminology used herein is for the purpose of describing particular embodiments only and is not intended to be limiting of exemplary embodiments. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Figure 1:
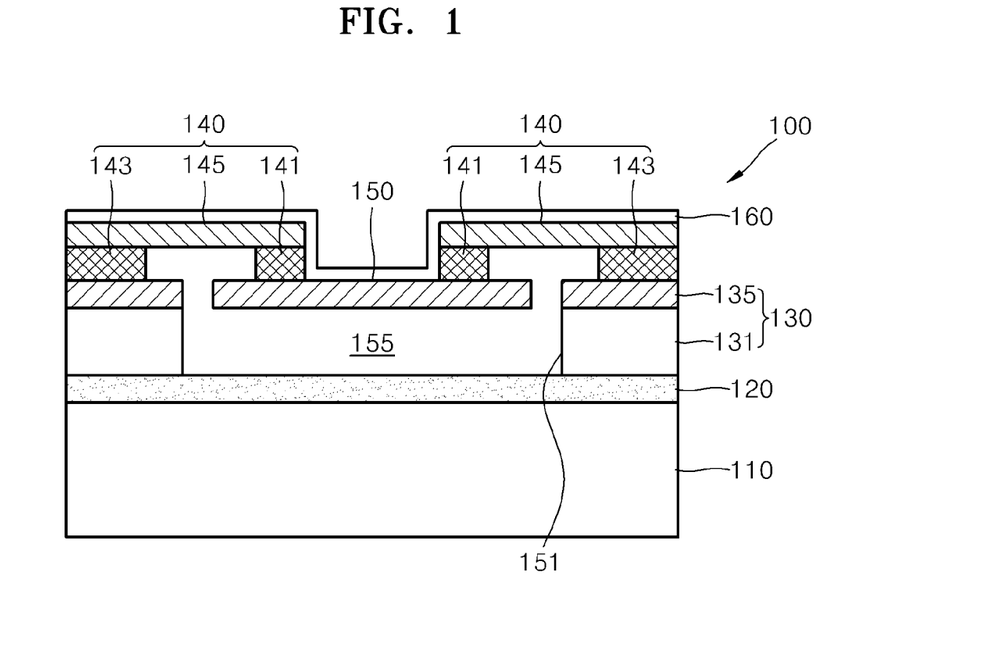
FIG. 1 is a schematic cross-sectional view of an ultrasonic transducer according to an exemplary embodiment.

In the drawings, the thicknesses of layers and regions are exaggerated for clarity FIG. 1 is a schematic cross-sectional view of an ultrasonic transducer 100 according to an exemplary embodiment.

Referring to FIG. 1, the ultrasonic transducer 100 may include a substrate 110, a supporting unit 130 formed on the substrate 110, a thin film 150 formed over the substrate 110 and the supporting unit 130 separately from the substrate 110 and the supporting unit 130, and a connection unit 140 that connects the supporting unit 130 and the thin-film 150. Also, the ultrasonic transducer 100 may further include an electrode layer 160 formed on the thin-film 150. Here, if the substrate 110 comprises a conductive material, the electrode layer 160 and the substrate 110 may form a capacitor, and thus, the ultrasonic transducer 100 may be a capacitive micromachined ultrasonic transducer (cMUT).

The substrate 110 may be formed of a conventional material, for example, silicon or glass. Also, the substrate 110 may include an electrically conductive material. For example, the substrate 110 may include highly doped silicon, that is, silicon having a low resistance, and accordingly, may be used as a lower electrode. An insulating layer 120 may further be disposed on the substrate 110 to insulate the electrode layer 160 from the substrate 110 to prevent a short circuit between the electrode layer 160 and the substrate 110. Also, the insulating layer 120 may include an oxide or a nitride, for example, silicon oxide.

The supporting unit 130 having a through-hole 151 may be formed on the substrate 110. The supporting unit 130 may include a first supporting unit 131 formed on the substrate 110 and a second supporting unit 135 formed on the first supporting unit 131. The first and second supporting units 131 and 135 may be formed of different materials. For example, the first supporting unit 131 may be formed of an oxide or a nitride, and more specifically, silicon oxide, and the second supporting unit 135 may be formed of silicon. For example, the through-hole 151 may be formed by etching the first supporting unit 131 formed of silicon oxide.

The thin-film 150 may be formed over the substrate 110, separately from the substrate 110 and the supporting unit 130. The thin-film 150 may be formed in the through-hole 151 formed in the supporting unit 130 or may be formed over regions of the substrate 110 corresponding to the supporting unit 130, separately from the substrate 110. The thin-film 150 and the second supporting unit 135 may constitute a device wafer included in a silicon on insulator (SOI) wafer, and accordingly, may be formed of the same material. The thin-film 150 may be formed of, for example, silicon. A shape of the thin-film 150, as viewed from above, may be a circular shape. However, the thin-film 150 is not limited thereto, and may be formed in other shapes such as a polygonal shape.

The through-hole 151 formed in the supporting unit 130 may form a single cavity 155 bounded by the substrate 110, the supporting unit 130, the connection unit 140, and the thin-film 150. Also, the cavity 155 may be in a vacuum state. A gap between the substrate 110 and the thin film 150 may be determined according to the height of the first supporting unit 131. Since the first supporting unit 131 is formed by, for example, a silicon oxidation process and an etching process, the gap between the substrate 110 and the thin-film 150 may be uniform.

The connection unit 140 may connect the supporting unit 130 to the thin-film 150. The connection unit 140 may have a shape of, for example, a tube cut in half in a horizontal direction and a cross-section thereof may be a bridge shape. The connection unit 140 may include first and second connection units 141 and 143 and a deformation unit 145 that connects the first and second connection units 141 and 143. The first connection unit 141 may be formed on the thin-film

150. More specifically, the first connection unit 141 may be connected to an upper surface of the thin-film 150 having a circular shape and may be formed in a ring shape on an edge of the thin-film 150.

The second connection unit 143 may be formed on the supporting unit 130, and more specifically, on the second supporting unit 135. For example, the second connection unit 143 may be connected to an upper surface of the second supporting unit 135, and may be formed as a ring shape on an edge of the second supporting unit 135. Also, a distance between the first and second connection units 141 and 143 may be equal to or greater than a distance between the thin-film 150 and the second supporting unit 135. The first and second connection units 141 and 143 may be formed of an oxide or a nitride, and more specifically, may be formed of silicon oxide.

The deformation unit 145 may be formed on the first and second connection units 141 and 143 to connect the first and second connection units 141 and 143. Also, the deformation unit 145 may be formed parallel to the substrate 110 and the thin-film 150. The deformation unit 145 may be formed of an elastic material or may be formed thin to be elastically deformable. The thin-film 150 may vibrate in a direction perpendicular to the substrate 110 due to the elastic deformation of the deformation unit 145. That is, the thin-film 150 may move up or down with respect to the substrate 110 like a piston. Accordingly, an average electrostatic force between the substrate 110 and the electrode layer 160 and a volume change of the cavity 155 in the ultrasonic transducer 100 may be increased. The increase in the average electrostatic force and the volume change of the ultrasonic transducer 100 may increase the transmission output and the receiving sensitivity of the ultrasonic transducer 100.

The electrode layer 160 may be formed on the connection unit 140, as well as on the thin-film 150, as shown in FIG. 1. The electrode layer 160 may also be formed on the supporting unit 130. The electrode layer 160 may be formed of, for example, a metal selected from the group consisting of Cu, Al, Au, Ag, Cr, Mo, Ti, Pt, and an alloy of these metals. The electrode layer 160 may be electrically connected to an external circuit through, for example, a via (not shown) formed in the substrate 110 and the supporting unit 130.

Also, the substrate 110, the second supporting unit 135, the thin-film 150, and/or the deformation unit 145 of the ultrasonic transducer 100 may be formed of single-crystalline silicon. Therefore, residual stress on the ultrasonic transducer 100 may be reduced.

Next, an operation way of the ultrasonic transducer 100 will be described. First, the receiving way of ultrasonic waves is as follows. When a DC voltage (not shown) is applied to the substrate 110, which is a lower electrode, and to the electrode layer 160, which is an upper electrode, the thin-film 150 may be positioned at a height where an electrostatic force between the substrate 110 and the electrode layer 160 and the gravitational force that effects on the thin-film 150 are parallel to each other. In the state that a DC voltage (not shown) is applied to the substrate 110 and the electrode layer 160, when an AC voltage is applied to the substrate 110 and the electrode layer 160, the thin-film 150 may vibrate due to the change of the electrostatic force between the substrate 110 and the electrode layer 160, and thus, an ultrasonic wave may be transmitted from the thin-film 150 by the vibration. In the ultrasonic transducer 100, the thin-film 150 is not itself deformed to vibrate, but rather the deformation unit 145 is deformed to vibrate. Since edges of the thin-film 150 are not directly fixed on the supporting unit 130, the degree of freedom of the thin-film 150 may be increased. Accordingly, the thin-film 150 may remain substantially parallel to the substrate 110 and may move in a direction perpendicular to the substrate 110 without bending like a bow. That is, the thin-film 150 may move up or down with respect to the substrate 110 like a piston, and thus, the volume change of the cavity 155 included in the ultrasonic transducer 100 may be increased.

When the thin-film 150 of the ultrasonic transducer 100 vibrates, a first gap between a central portion of the thin-film 150 and the substrate 110 and a second gap between an edge portion of the thin-film 150 and the substrate 110 may remain equal to or similar to each other. Therefore, between the substrate 110 and the electrode layer 160, an electrostatic force between a central portion of the electrode layer 160 and the substrate 110 may be equal to or similar to an electrostatic force between edges of the electrode layer 160 and the substrate 110. That is, a uniform electrostatic force may be distributed between the electrode layer 160 and the substrate 110. Accordingly, the average electrostatic force between the substrate 110 and the electrode layer 160 may be increased. As described above, since the volume change and the average electrostatic force of the ultrasonic transducer 100 is increased, the transmission output of the ultrasonic transducer 100 is increased.

The ultrasonic wave-receiving method of the ultrasonic transducer 100 is as follows. As in the ultrasonic wave transmission, when a DC voltage (not shown) is applied to the substrate 110 and the electrode layer 160, the thin-film 150 may be positioned at a height at which an electrostatic force between the substrate 110 and the electrode layer 160 and the gravitational force that effects on the thin-film 150 are parallel to each other. In the state that a DC voltage (not shown) is applied to the substrate 110 and the electrode layer 160, when a physical signal, for example, an ultrasonic wave is applied to the thin-film 150 from the outside, the electrostatic force between the substrate 110 and the electrode layer 160 may change. Thus, an ultrasonic wave may be received from the outside, and a resultant changed electrostatic force may be sensed. Also, as in the transmission the thin-film 150 of the ultrasonic transducer 100 may remain substantially parallel to the substrate 110, and move in a direction perpendicular with respect to the substrate 110. Accordingly, as described above, since the volume change of the cavity 155 and the average electrostatic force between the substrate 110 and the electrode layer 160 are increased, the receiving sensitivity of the ultrasonic transducer 100 is increased.

Figure 2A:
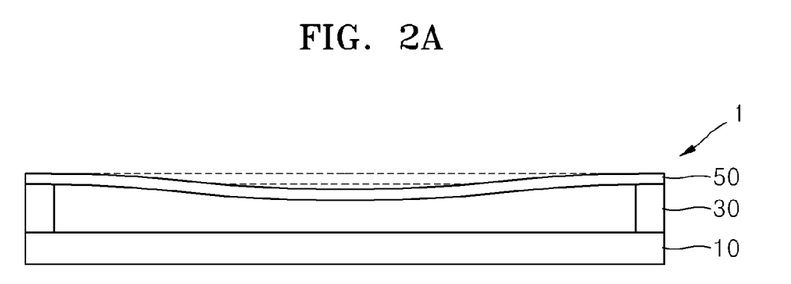
FIGS. 2A and 2B are schematic cross-sectional views of ultrasonic transducers according to comparative examples.
Figure 2B:
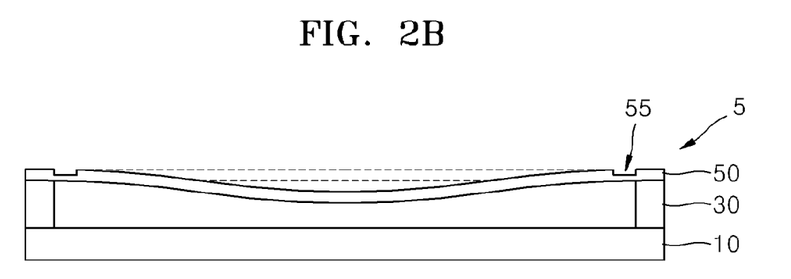
Figure 2C:
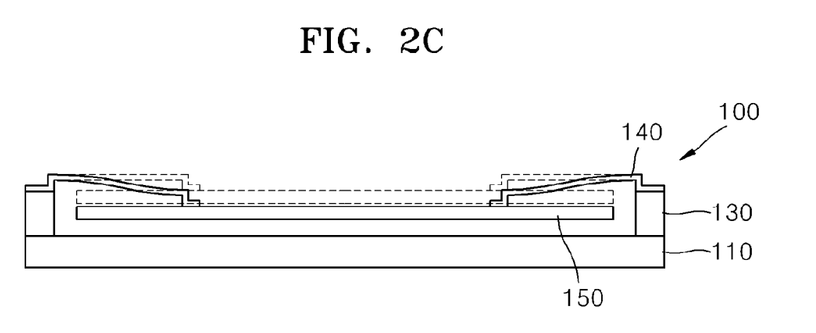
FIG. 2C is a schematic cross-sectional view of the ultrasonic transducer of FIG. 1.

FIGS. 2A and 2B are schematic cross-sectional views of ultrasonic transducers 1 and 5 according to comparative examples, and FIG. 2C is a schematic cross-sectional view of the ultrasonic transducer 100. Here, each of the thicknesses of thin-films 50 and 150 are equal, and the thin-film 50 where a trench 55 is formed has a thickness of a half of the rest of the thin-film 50. Also, the connection unit 140 has a thickness of a half of that of the thin-film 150.

Referring to FIG. 2A, in the ultrasonic transducer 1 according to the comparative example, an edge of the thin-film 50 is fixed on a supporting unit 30, that is, in a clamped state. Referring to FIG. 2B, in the ultrasonic transducer 5 according to the comparative example, an edge of the thin-film 50 is fixed on a supporting unit 30, that is, in a clamped state. However, the trench 55 is formed in the edge of the thin-film 50. The trench 55 may relieve the clamping condition of the thin-film 50 of the ultrasonic transducer 5. From a simulation result, the volume change of the ultrasonic transducer 5 of FIG. 2B is greater than that of the ultrasonic transducer 1 of FIG. 2A. Also, the average electrostatic force of the ultrasonic transducer 5 of FIG. 2B is greater than that of the ultrasonic transducer 1 of FIG. 2A.

Referring to FIG. 2C, in the ultrasonic transducer 100 according to an exemplary embodiment, the thin-film 150 is not directly fixed on the supporting unit 130 but is fixed on the supporting unit 130 through the connection unit 140. Accordingly, the clamping condition of the thin-film 150 may further be relieved as compared to the ultrasonic transducers 1 and 5 according to the comparative examples, and thus, the thin-film 150 may be moved up or down with respect to the substrate 110 like a piston. From a simulation result, the ultrasonic transducer 100 has further increased volume change and average electrostatic force as compared to those of the ultrasonic transducers 1 and 5 according to the comparative examples. Accordingly, the ultrasonic transducer 100 may have a greater transmission output and receiving sensitivity than the ultrasonic transducers 1 and 5 according to the comparative examples.

Figure 3:
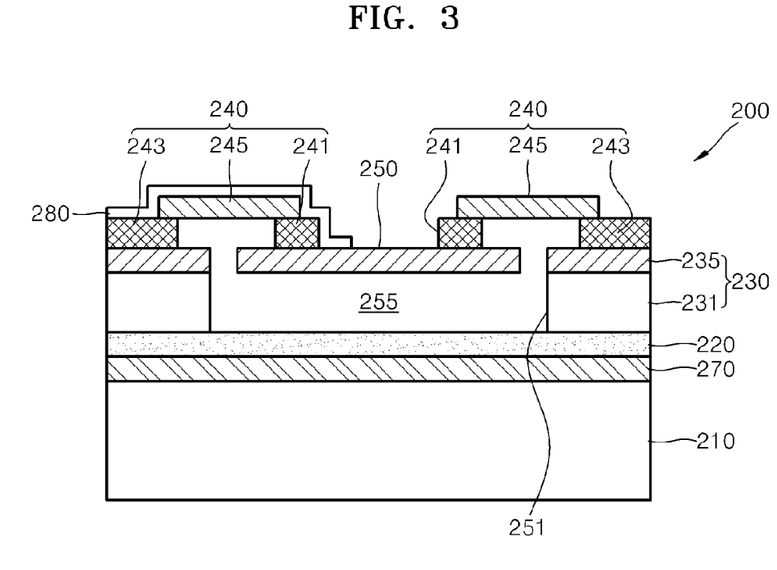
FIG. 3 is a schematic cross-sectional view of an ultrasonic transducer according to another exemplary embodiment.

FIG. 3 is a schematic cross-sectional view of an ultrasonic transducer 200 according to another exemplary embodiment.

Referring to FIG. 3, the ultrasonic transducer 200 may include a substrate 210, a supporting unit 230 formed on the substrate 210, a conductive thin-film 250 formed on the substrate 210 and separately from the substrate 210 and the supporting unit 230, and a connection unit 240 that connects the supporting unit 230 and the conductive thin-film 250. The ultrasonic transducer 200 may further include a lower electrode layer 270 on the substrate 210. Here, the conductive thin-film 250 and the lower electrode layer 270 may form a capacitor, and accordingly, the ultrasonic transducer 200 may be a cMUT.

The substrate 210 may be formed of a conventional material, for example, silicon or glass. However, the material for forming the substrate 210 is not limited thereto, and the substrate 210 may be formed of a conductive material. For example, the substrate 210 may include highly doped silicon, that is, silicon having a low resistance, and thus, may be used as a lower electrode. However, if the substrate 210 is not a conductive substrate, the lower electrode layer 270 may further be formed on the substrate 210. The lower electrode layer 270 may be formed of a metal selected from the group consisting of Cu, Al, Au, Ag, Cr, Mo, Ti, Pt, and an alloy of these metals. Also, an insulating layer 220 may further be formed on the lower electrode layer 270 to insulate the lower electrode layer 270 from the conductive thin-film 250 to prevent a short circuit between the lower electrode layer 270 and the conductive thin-film 250. The insulating layer 220 may be formed of an oxide or a nitride, for example, silicon nitride.

Also, the supporting unit 230 having a through-hole 251 may be formed on the substrate 210. The supporting unit 230 may include a first supporting unit 231 formed on the substrate 210 and a second supporting unit 235 formed on the first supporting unit 231. The first and second supporting units 231 and 235 may be formed of different materials. For example, the first supporting unit 231 may be formed of an oxide or a nitride, more specifically, silicon oxide, and the second supporting unit 235 may be formed of silicon. For example, the through-hole 251 may be formed by etching the first supporting unit 231 formed of silicon oxide.

The conductive thin-film 250 may be formed on the substrate 210 and may be separated from the substrate 210 and the supporting unit 230. That is, the conductive thin-film 250 may be formed in the through-hole 251 formed in the supporting unit 230 or may be formed on regions of the substrate 210 corresponding to the supporting unit 230 separately from the substrate 210. The conductive thin-film 250 and the second supporting unit 235 may constitute a device wafer included in an SOI wafer, and accordingly, may be formed of the same material. The conductive thin-film 250 may be formed of, for example, silicon. The conductive thin-film 250 may be formed of highly doped silicon, that is, silicon having a low resistance, and accordingly, may be used as an upper electrode. A shape of the conductive thin-film 250, as viewed from above, may be a circular shape. However, the conductive thin-film 250 is not limited thereto, and may be formed in other shapes such as a polygonal shape.

The through-hole 251 formed in the supporting unit 230 may form a single cavity 255 bound by the substrate 210, the supporting unit 230, the connection unit 240, and the conductive thin-film 250. An inner side of the cavity 255 may be in a vacuum state. A gap between the substrate 210 and the conductive thin-film 250 may be determined according to the height of the first supporting unit 231. Since the first supporting unit 231 is formed by, for example, a silicon oxidation process and an etching process, the gap between the substrate 210 and the conductive thin-film 250 may be uniform. A feeder 280 may be formed on the connection unit 240 and may be connected to the conductive thin-film 250. The feeder 280 may input an electrical signal to the conductive thin-film 250 or may transmit the change of electrical signal between the lower electrode layer 270 and the conductive thin-film 250 to the outside. The feeder 280 may be formed of a metal selected from the group consisting of Cu, Al, Au, Ag, Cr, Mo, Ti, Pt, and an alloy of these metals.

The connection unit 240 may connect the supporting unit 230 to the conductive thin-film 250. The connection unit 240 may have a shape of, for example, a tube cut in half in a horizontal direction and a cross-section thereof may be a bridge shape. The connection unit 240 may include first and second connection units 241 and 243 and a deformation unit 245 that connects the first and second connection units 241 and 243. The first connection unit 241 may be formed on the conductive thin-film 250. More specifically, the first connection unit 241 may be connected to an upper surface of the conductive thin-film 250 having a circular shape and may be formed in a ring shape on an edge of the conductive thin-film 250.

The second connection unit 243 may be formed on the supporting unit 230, and more specifically, on the second supporting unit 235. Also, a distance between the first and second connection units 241 and 243 may be equal to or greater than a distance between the conductive thin-film 250 and the second supporting unit 235. The first and second connection units 241 and 243 may be formed of the same material, for example, an oxide or a nitride, and more specifically, may be formed of silicon oxide.

The deformation unit 245 may be formed between the first and second connection units 241 and 243 to connect them. Also, the deformation unit 245 may be formed parallel to the substrate 210 and the conductive thin-film 250. The deformation unit 245 may be formed of an elastic material or may be formed thin to be elastically deformable. The conductive thin-film 250 may vibrate in a direction perpendicular to the substrate 210 due to the elastic deformation of the deformation unit 245. That is, the conductive thin-film 250 may move up or down with respect to the substrate 210 like a piston. Accordingly, in the ultrasonic transducer 200, an average electrostatic force between the conductive thin-film 250 and the lower electrode layer 270 and a volume change of the cavity 255 due to the vibration of the conductive thin-film 250 may be increased. As described above, the increase in the average electrostatic force and the volume change of the ultrasonic transducer 200 may increase the transmission output and the receiving sensitivity of the ultrasonic transducer 200. The operation way of the ultrasonic transducer 200 is substantially the same as the operation way of the ultrasonic transducer 100, and thus, the description thereof will not be repeated. However, in the case of the ultrasonic transducer 200, a DC voltage (not shown) or an AC voltage (not shown) may be applied between the lower electrode layer 270, which is a lower electrode, and the conductive thin-film 250, which is an upper electrode.

Also, the substrate 210, the second supporting unit 235, the conductive thin-film 250, or the deformation unit 245 of the ultrasonic transducer 200 may be formed of single-crystalline silicon. Accordingly, residual stress on the ultrasonic transducer 200 may be reduced.

FIGS. 4A through 4F are schematic cross-sectional views for explaining a method of manufacturing the ultrasonic transducer 100, according to an exemplary embodiment.

Figure 4A:
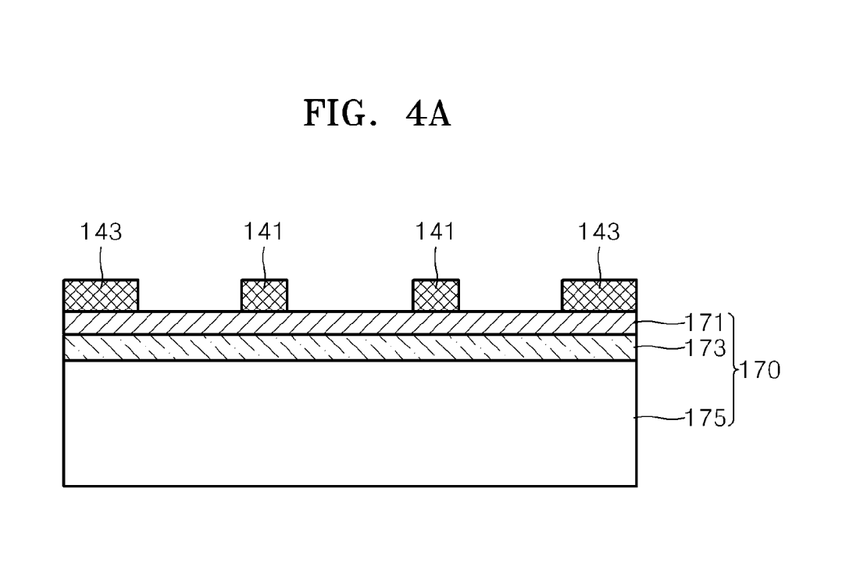
FIGS. 4A through 4F are schematic cross-sectional views for explaining a method of manufacturing an ultrasonic transducer, according to an exemplary embodiment.

Referring to FIG. 4A, the connection unit may be formed on a first SOI wafer 170. The first SOI wafer 170 may include, sequentially stacked, a first handle wafer 175, a first insulating layer 173, and a first device wafer 171. The first handle wafer 175 and the first device wafer 171 may be formed of, for example, silicon, and the first insulating layer 173 may be formed of silicon oxide. The connection unit may be formed on the first device wafer 171. For example, a first oxide layer may be formed on the first device wafer 171 by oxidizing a surface of the first device wafer 171. Afterwards, the connection unit may be formed by patterning the first oxide layer. For example, when the first device wafer 171 is formed of silicon, the first oxide layer may be a silicon oxide layer. The connection unit may include the first connection unit 141 and the second connection unit 143. The first connection unit 141 may be connected to the thin-film 150 (refer to FIG. 4D), and the second connection unit 143 may be connected to the supporting unit 130 (refer to FIG. 4D). The first connection unit 141 may be formed inside of the second connection unit 143. The first and second connection units 141 and 143 may be formed as a concentric circle in a plan view.

Figure 4B:
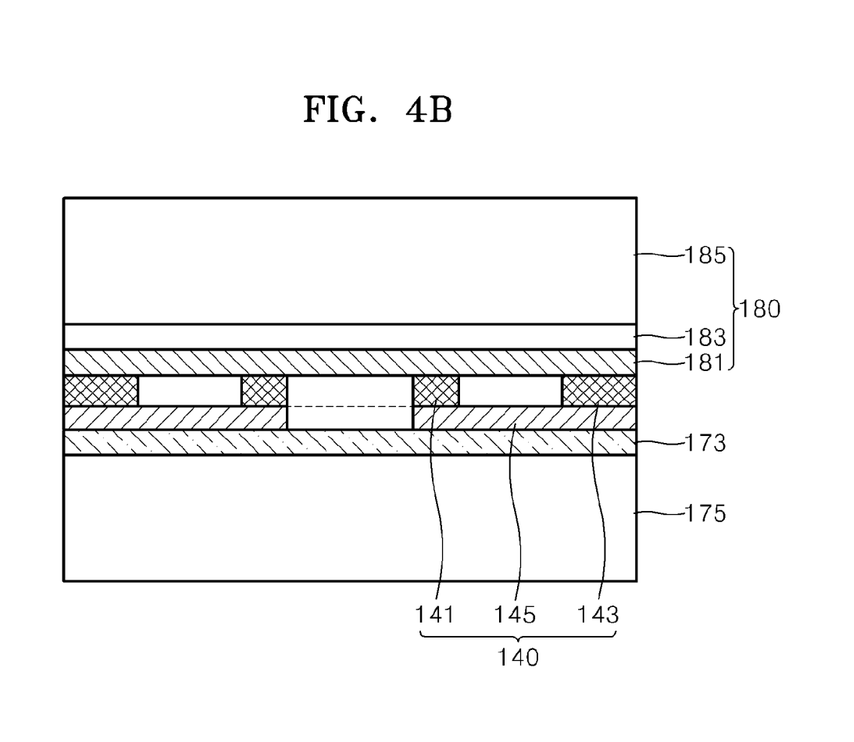

Referring to FIG. 4B, the deformation unit 145 may be formed by patterning the first device wafer 171. The deformation unit 145 may be formed by etching the first device wafer 171 below the inside of the first connection unit 141. The deformation unit 145 may be formed below the first and second connection units 141 and 143 and may connect the first and second connection units 141 and 143. The deformation unit 145 may be formed of an elastic material or may be formed thin to be elastically deformed. For example, the deformation unit 145 may be formed of silicon. The connection unit 140 may include the deformation unit 145 and the first and second connection units 141 and 143.

A second SOI wafer 180 may be bonded onto the first and second connection units 141 and 143. The second SOI wafer 180 may include sequentially stacked a second handle wafer 185, a second insulating layer 183, and a second device wafer 181. The second handle wafer 185 and the second device wafer 181 may be formed of, for example, silicon, and the second insulating layer 183 may be formed of silicon oxide. The second device wafer 181 may be bonded onto the first and second connection units 141 and 143 by, for example, a silicon direct bonding (SDB) method. Also, since the second SOI wafer 180 does not include a patterned portion, the second SOI wafer 180 may be bonded onto the first and second connection units 141 and 143 without performing an aligning process. That is, in the method of manufacturing the ultrasonic transducer 100, the patterned first SOI wafer 170 and the un-patterned second SOI wafer 180 may be bonded without performing an aligning process. Thus, the method of manufacturing the ultrasonic transducer 100 may remove or minimize aligning errors between wafers.

Figure 4C:
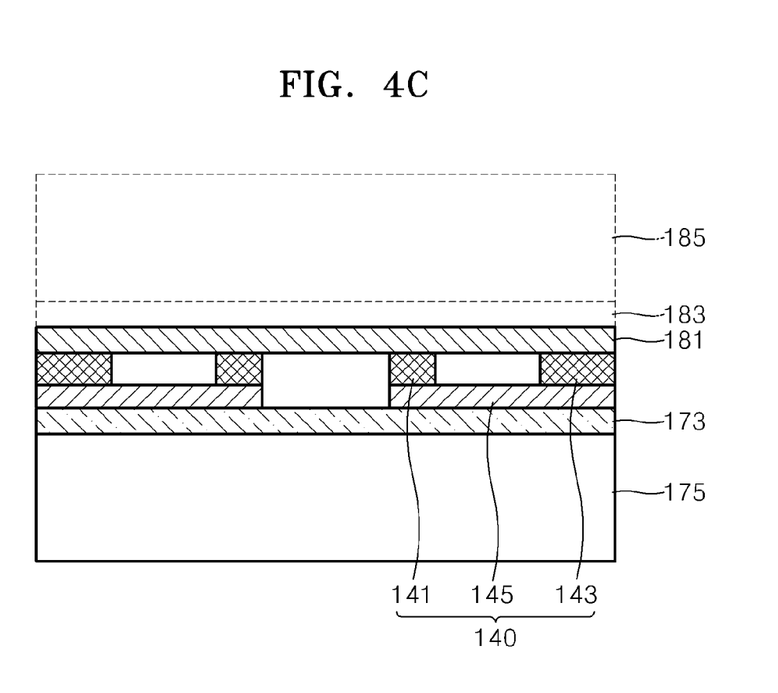

Referring to FIG. 4C, except for the second device wafer 181, the second insulating layer 183 and the second handle wafer 185 formed above the first and second connection units 141 and 143 are removed. The second handle wafer 185 and the second insulating layer 183 may be removed by, for example, an etching process or a polishing process. The second device wafer 181, which is formed into the thin-film 150 (refer to FIG. 4D) and the second supporting unit 135 (refer to FIG. 4D) in a subsequent process, may remain on the first and second connection units 141 and 143.

Figure 4D:
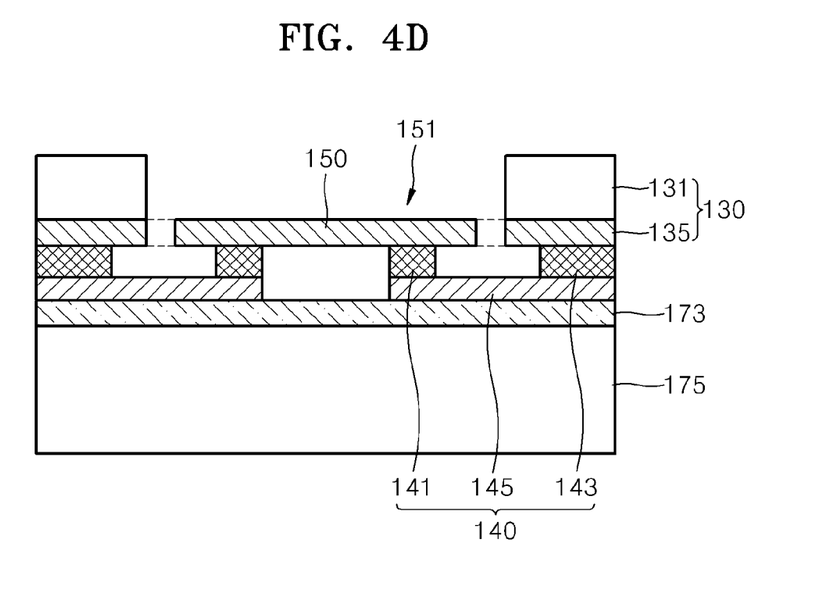

Referring to FIG. 4D, the first supporting unit 131 may be formed on an edge of the second device wafer 181. For example, a second oxide layer may be formed on the second device wafer 181 by oxidizing a surface of the second device wafer 181. Afterwards, the first supporting unit 131 may be formed by patterning the second oxide layer. That is, the second oxide layer may be formed in the first supporting unit 131 by forming the through-hole 151 in the second oxide layer. For example, when the second device wafer 181 is formed of silicon, the second oxide layer may be a silicon oxide layer.

Next, the thin-film 150 and the second supporting unit 135 may be formed by patterning the second device wafer 181. For example, a portion of the second device wafer 181 corresponding to a region between the first and second connection units 141 and 143 may be removed by etching. Accordingly, the first connection unit 141 is connected to the thin-film 150 to support the thin-film 150, and the second connection unit 143 is connected to the second supporting unit 135. The first supporting unit 131 and the second supporting unit 135 may form the supporting unit 130. Since the thin-film 150 and the second supporting unit 135 are formed from the second device wafer 181, the thin-film 150 and the second supporting unit 135 may be formed of the same material. For example, the thin-film 150 and the second supporting unit 135 may be formed of silicon.

Figure 4E:
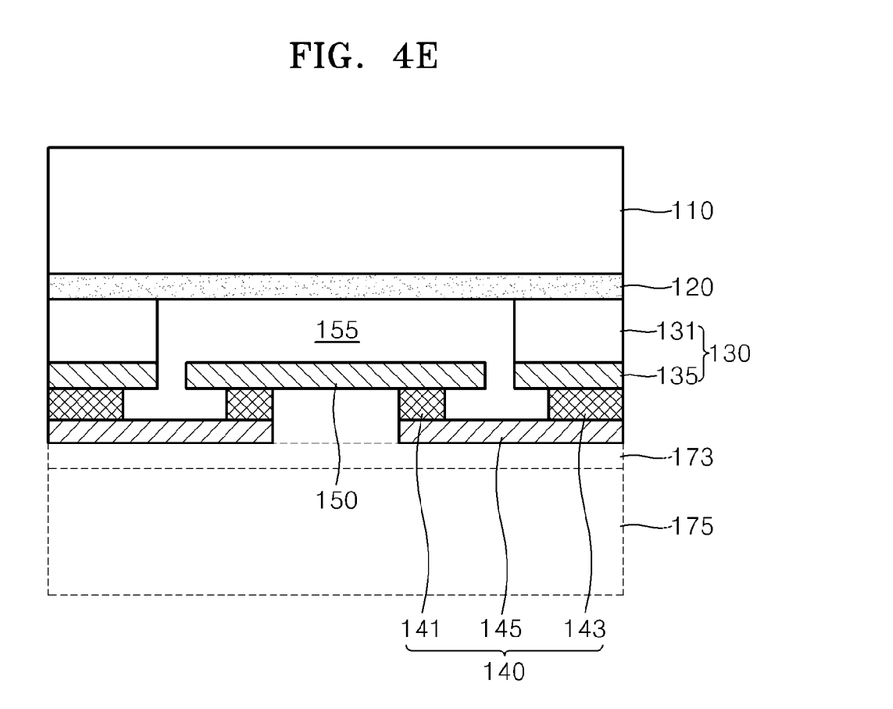

Referring to FIG. 4E, the substrate 110 (hereinafter referred to as the wafer 110) may be bonded onto the first supporting unit 131. The wafer 110 may be formed of silicon and also, may include a conductive material. For example, the wafer 110 may be highly doped silicon, that is, silicon having low resistance, and thus, may be used as an electrode. The first supporting unit 131 and the wafer 110 may be bonded by, for example, an SDB method. Also, since the wafer 110 does not include a patterned portion, the wafer 110 may be bonded onto the first supporting unit 131 without performing an aligning process. That is, the method of manufacturing the ultrasonic transducer 100 may bond the patterned first SOI wafer 170 and the un-patterned wafer 110 without performing an aligning process. Accordingly, the method of manufacturing the ultrasonic transducer 100 may remove or minimize aligning errors between wafers.

Also, the insulating layer 120 may further be formed on the wafer 110. For example, the insulating layer 120 may be formed by oxidizing a surface of the wafer 110. The through-hole 151 formed in the first supporting unit 131 may form the cavity 155 by being sealed with the wafer 110, the supporting unit 130, the connection unit 140, and the thin-film 150. An inner side of the cavity 155 may be in a vacuum state. When the wafer 110 does not include any conductive material, as depicted in FIG. 3, the lower electrode layer 270 may further be formed on the wafer 110.

Afterwards, the first insulating layer 173 and the first handle wafer 175 of the first SOI wafer 170 may be removed. The first insulating layer 173 and the first handle wafer 175 may be removed by, for example, an etching process or a polishing process.

Figure 4F:
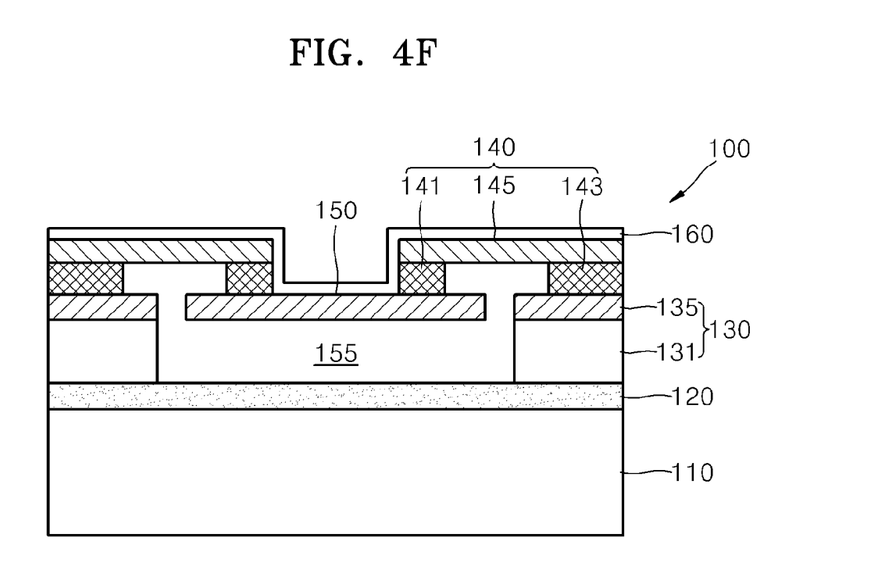

FIG. 4F shows the ultrasonic transducer 100 of FIG. 4E turned over upside down. Referring to FIG. 4F, the electrode layer 160 may be formed on the connection unit 140 and the thin-film 150. For example, the electrode layer 160 may be formed by depositing a conductive material on the connection unit 140 and the thin-film 150. The electrode layer 160 may be formed of a metal, for example, selected from the group consisting of Cu, Al, Au, Ag, Cr, Mo, Ti, Pt, and an alloy of these metals. The ultrasonic transducer 100, the substrate 110, the second supporting unit 135, the thin-film 150, and the deformation unit 145 may be formed of single-crystalline silicon. Accordingly, residual stress on the ultrasonic transducer 100 may be reduced.

While an ultrasonic transducer and a method of manufacturing the ultrasonic transducer, according to exemplary embodiments have been particularly shown and described, it will be understood by those of ordinary skill in the art that various changes in form and details may be made therein without departing from the spirit and scope of the inventive concept as defined by the following claims and their equivalents.

What is claimed is:

1. An ultrasonic transducer comprising:
   a substrate;
   a supporting unit disposed on the substrate, the supporting unit comprising a recess;
   a thin-film disposed in a region corresponding to the recess, wherein the thin-film is separated from the substrate and the supporting unit; and
   a connection unit which connects the supporting unit to the thin-film,
   wherein the supporting unit extends underneath the connection unit toward the thin-film so that an edge portion of the supporting unit is disposed beyond a contact point of the supporting unit and the connection unit.

2. The ultrasonic transducer of claim 1, wherein the connection unit comprises:
   a first connection unit part connected to the thin-film;
   a second connection unit part connected to the supporting unit; and
   a deformation unit connecting the first and second connection unit parts, wherein the deformation unit is elastically deformable.

3. The ultrasonic transducer of claim 2, wherein the thin-film vibrates in a direction substantially perpendicular to the substrate due to a deformation of the deformation unit.

4. The ultrasonic transducer of claim 1, wherein the supporting unit comprises:
   a first supporting unit part disposed on the substrate; and
   a second supporting unit part disposed on the first supporting unit.

5. The ultrasonic transducer of claim 4, wherein the first and second supporting unit parts comprise different materials.

6. The ultrasonic transducer of claim 4, wherein the thin-film and the second supporting unit part comprise the same material.

7. The ultrasonic transducer of claim 4, wherein a gap between the substrate and the thin-film is defined by a height of the first supporting unit.

8. The ultrasonic transducer of claim 1, further comprising an insulating layer disposed on the substrate.

9. The ultrasonic transducer of claim 1, further comprising an electrode layer disposed on the thin-film and the connection unit.

10. The ultrasonic transducer of claim 1, wherein the substrate, the supporting unit, the thin-film, and the connection unit together define a cavity.

11. The ultrasonic transducer of claim 1, wherein at least one of the substrate and the thin-film comprises a conductive material.

12. The ultrasonic transducer of claim 1, wherein the thin-film is substantially parallel to an upper surface of the substrate.

13. The ultrasonic transducer of claim 1, wherein the edge portion of the supporting unit comprises an edge which is disposed in a cavity underneath the connection portion and proximate the thin-film.

* * * * *